United States Patent
Lee et al.

(10) Patent No.: US 8,790,470 B2
(45) Date of Patent: Jul. 29, 2014

(54) ETCHING, CLEANING AND DRYING METHODS USING SUPERCRITICAL FLUID AND CHAMBER SYSTEMS USING THESE METHODS

(75) Inventors: Hyo-san Lee, Suwon-si (KR); Chang-Ki Hong, Sungnam-si (KR); Kun-Tack Lee, Sungnam-si (KR); Woo-Gwan Shim, Yongin-si (KR); Jeong-Nam Han, Seoul (KR); Jung-Min Oh, Incheon (KR); Kwon-Taek Lim, Busan (KR); Ha-Soo Hwang, Busan (KR); Haldorai Yuvaraj, Busan (KR); Jae-Mok Jung, Busan (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 13/326,940

(22) Filed: Dec. 15, 2011

(65) Prior Publication Data

US 2012/0085495 A1 Apr. 12, 2012

Related U.S. Application Data

(62) Division of application No. 11/752,834, filed on May 23, 2007, now Pat. No. 8,084,367.

(30) Foreign Application Priority Data

May 24, 2006 (KR) .................. 10-2006-0046667
Jan. 5, 2007 (KR) .................. 10-2007-0001514

(51) Int. Cl.
*B08B 3/00* (2006.01)
*H01L 21/67* (2006.01)
*H01L 21/02* (2006.01)
*H01L 21/311* (2006.01)
*H01L 27/108* (2006.01)

(52) U.S. Cl.
CPC ...... *H01L 21/02101* (2013.01); *H01L 21/6708* (2013.01); *H01L 21/31111* (2013.01); *H01L 21/67051* (2013.01); *H01L 27/10852* (2013.01); *Y10S 134/902* (2013.01)
USPC .............. 134/56 R; 134/2; 134/902; 134/1.3; 134/22.19; 156/345.26; 156/345.27; 438/745; 438/689

(58) Field of Classification Search
CPC .............. B08B 7/0021; Y10S 134/902; H01L 21/02101; H01L 21/67051; C11D 11/0047
USPC ............................... 134/18, 30, 61, 99.1, 110
See application file for complete search history.

(56) References Cited

U.S. PATENT DOCUMENTS

| | | | |
|---|---|---|---|
| 2004/0266205 A1* | 12/2004 | Han et al. ...................... | 438/708 |
| 2005/0229970 A1* | 10/2005 | Birtcher et al. ............... | 137/240 |
| 2005/0244312 A1* | 11/2005 | Suppes et al. ................. | 422/198 |
| 2008/0271991 A1* | 11/2008 | Korzenski et al. ....... | 204/192.32 |

\* cited by examiner

*Primary Examiner* — Michael Barr
*Assistant Examiner* — Thomas Bucci
(74) *Attorney, Agent, or Firm* — Muir Patent Consulting, PLLC

(57) ABSTRACT

Provided herein are etching, cleaning and drying methods using a supercritical fluid, and a chamber system for conducting the same. The etching method includes etching the material layer using a supercritical carbon dioxide in which an etching chemical is dissolved, and removing an etching by-product created from a reaction between the material layer and the etching chemical using a supercritical carbon dioxide in which a cleaning chemical is dissolved. Methods of manufacturing a semiconductor device are also provided.

35 Claims, 16 Drawing Sheets

Phase diagram of pure $CO_2$

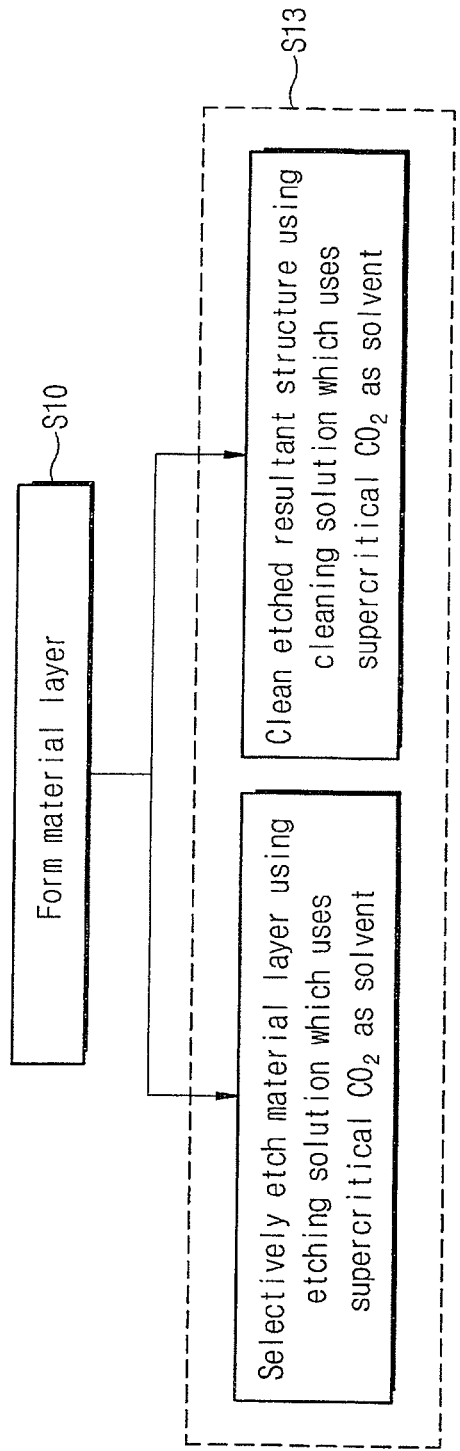

ETCHING, CLEANING AND DRYING METHODS USING SUPERCRITICAL FLUID AND CHAMBER SYSTEMS USING THESE METHODS

CROSS-REFERENCE TO RELATED APPLICATIONS

This application is a divisional application of co-pending U.S. application Ser. No. 11/752,834 filed May 23, 2007, which claims priority to Korean Patent Application Nos. 2006-046667, filed on May 24, 2006, and 2007-001514, filed on Jan. 5, 2007, the disclosures of which are each hereby incorporated by reference herein in their entireties.

FIELD OF THE INVENTION

The invention provided herein relates to methods for processing a thin film using supercritical fluids and systems using these methods.

BACKGROUND

In general, a material is in one of a solid, liquid or gaseous state according to the temperature and pressure. For example, as pressure increases under a constant temperature, gas can be generally liquefied. However, above a critical temperature and pressure, a material can be in the supercritical state, and the material may not be liquefied regardless of a further increase of pressure. In a phase diagram, the minimum temperature and pressure from which the supercritical state starts is generally referred to as the "critical point."

When carbon dioxide ($CO_2$), for example, is fed into a closed container and heated to a temperature and pressure exceeding the critical point, in general, the boundary between gas and liquid disappears. Unlike the properties of a typical liquid solvent, the physical properties of a material in the supercritical state (hereinafter referred to as "supercritical fluid"), for example, density, viscosity, diffusion coefficient, polarity and the like, can be continuously changed from gas-like to liquid-like as the pressure is varied.

Supercritical fluid may have a high dissolution, a high diffusion coefficient, low viscosity and low surface tension. Therefore, as a method for overcoming technical problems related with the efficiency, quality, reaction rate and environment in a typical process (such as reaction, decomposition, extraction, distillation, crystallization, absorption, adsorption, drying and cleaning), technologies employing supercritical fluid can be used. Carbon dioxide may be a particularly useful material for, e.g., a process of manufacturing a capacitor constituting a memory cell of a dynamic random access memory (DRAM), because, at least in part, it has a critical temperature of 31° C. and a critical pressure of 73 atm, and is also generally nontoxic, nonflammable and inexpensive. For instance, Korean Patent Laid Open Publication No. 2005-0074844 discusses a method of manufacturing a microelectronic device including removing a thin film using supercritical carbon dioxide as a solvent. Hereinafter, a process of manufacturing a capacitor using a conventional method and a problem caused, at least in part, by the process will be described with reference to FIGS. 2 and 3. More specifically, FIG. 2 is a sectional view of memory cells of a conventional DRAM device, and FIG. 3 is a process flow diagram illustrating a method of manufacturing a DRAM device according to the related art.

Again referring to FIGS. 2 and 3, a lower structure 20 is formed on a semiconductor substrate 10 (S1). The lower structure 20 includes transistors 30, interconnection line structures 40 connecting the transistors 30, and an interlayer insulating layer 50 disposed between the transistors 30 and the interconnection line structures 40. Each of the transistors 30 includes a gate electrode 31 disposed on the semiconductor substrate 10, and impurity regions 32 formed in the semiconductor substrate 10 at both sides of the gate electrode 31. Each of the interconnection line structures 40 include a lower plug 41, an interconnection line layer 42 on the lower plug 41, and an upper plug 43 on the interconnection line layer 42. Also, the interlayer insulating layer 50 includes a lower interlayer insulating layer 51 and an upper interlayer insulating layer 52, which are sequentially stacked.

Thereafter, a first sacrificial layer 60 is formed on the lower structure 20 and is patterned to form openings 65 which expose the upper plugs 43 (S2). The first sacrificial layer 60 typically includes silicon oxide, and the upper interlayer insulating layer 52 includes a material that provides an etch selectivity for the first sacrificial layer 60. Owing to the etch selectivity, the openings 65 can be formed with a large aspect ratio (h/w), as shown in the drawing, with no or minimal damage to the lower structure 20.

Next, a lower electrode layer is formed in the openings 65, and then a second sacrificial layer 80 fills the openings 65 on which the lower electrode layer was formed. The second sacrificial layer 80 generally includes silicon oxide. Thereafter, the second sacrificial layer 80 and the lower electrode layer are etched until an upper surface of the first sacrificial layer 60 is exposed. As a result, the lower electrodes 70 of a capacitor constituting a memory cell of a DRAM device may be formed (S3) as shown in FIG. 2.

According to methods known in the art, the first and second sacrificial layers 60 and 80 are removed by a wet etch to expose the sidewalls of the lower electrodes 70 (S4). Thereafter, the resultant structure is cleaned using a cleaning solution to remove by-products generated in the etching process (S5). However, because the etching solution or cleaning solution used in these processes can have a surface tension of a few tens of dynes/cm, the flow of the etching solution or cleaning solution can cause the lower electrodes 70 having the large aspect ratio to lean.

In experiments etching silicon oxide using an etchant including a supercritical carbon dioxide as a solvent, and hydrofluoric acid (HF) and pyridine as etching chemicals, as shown in FIGS. 8A and 8B, it was found that etching by-products are generated from the HF and pyridine, which can be removed using de-ionized water. However, this cleaning can cause the lower electrode to lean. Therefore, methods are needed to prevent the leaning of the lower electrodes in this process.

SUMMARY OF THE INVENTION

Embodiments of the present invention provide methods of etching and cleaning a material layer including etching the material layer with a supercritical carbon dioxide which further includes an etching chemical; and removing an etching by-product created from a reaction between the material layer and the etching chemical with a supercritical carbon dioxide which further includes a cleaning chemical.

Embodiments of the present invention also provide methods of manufacturing a semiconductor device including forming conductive patterns and a silicon oxide layer disposed around the conductive patterns on a semiconductor substrate; selectively etching the silicon oxide layer using a supercritical carbon dioxide further including fluoride, pyridine ($C_5H_5N$), or combinations thereof; and removing an etching by-product generated in the etching using a supercritical carbon dioxide further including F-AOT, fluorine-based surfactants, alcohol, or combinations thereof.

Embodiments of the present invention further provide chamber systems that perform methods of treating a semiconductor substrate with a supercritical fluid, the chamber system including a process chamber into which a semiconductor substrate having a material layer formed thereon is loaded; a supplying unit supplying a fluid including a solvent in a supercritical state to the process chamber; a discharging unit discharging the used fluid from the process chamber; and a controller that controls operations, temperatures and/or pressures of the process chamber, the supplying unit and the discharging unit, wherein the controller maintains the process chamber at a condition above a critical temperature and/or pressure of the solvent during the treatment.

Embodiments of the present invention also provide methods of drying a water-soluble chemical including treating a material layer with the water-soluble chemical; and removing the water-soluble chemical using a supercritical fluid including a supercritical carbon dioxide and further including a surfactant.

BRIEF DESCRIPTION OF THE DRAWINGS

The above aspects of the present invention will become more apparent by describing in detail various embodiments thereof with reference to the attached drawings in which:

FIGS. 4A and 4B present process flow diagrams illustrating methods for etching and cleaning a material layer according to embodiments of the present invention.

DETAILED DESCRIPTION

Figure 1:
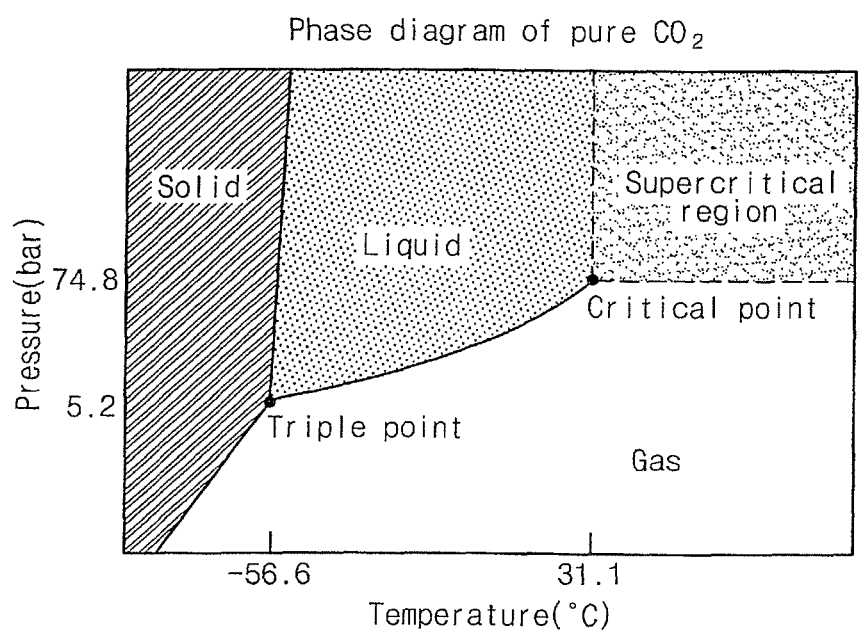
FIG. 1 presents a phase diagram of carbon dioxide.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art.

In the drawings, the size and relative sizes of layers and regions may be exaggerated for clarity. The drawings are not necessarily to scale. Like reference numerals designate like elements throughout the drawings.

It will also be understood that when an element or layer is referred to as being "on," "connected to" and/or "coupled to" another element or layer, the element or layer may be directly on, connected and/or coupled to the other element or layer or intervening elements or layers may be present. In contrast, when an element is referred to as being "directly on," "directly connected to" and/or "directly coupled to" another element or layer, no intervening elements or layers are present.

As used herein, the term "and/or" may include any and all combinations of one or more of the associated listed items and may be abbreviated as "/".

It will also be understood that, although the terms first, second, etc. may be used herein to describe various elements, components, regions, layers and/or sections. These elements, components, regions, layers and/or sections should not be limited by these terms. These terms may be used to distinguish one element, component, region, layer and/or section from another element, component, region, layer and/or section. For example, a first element, component, region, layer and/or section discussed below could be termed a second element, component, region, layer and/or section without departing from the teachings of the present invention.

Spatially relative teens, such as "beneath," "below," "lower," "above," "upper" and the like may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as "below" and/or "beneath" other elements or features would then be oriented "above" the other elements or features. The device may be otherwise oriented (e.g., rotated 90 degrees or at other orientations) and the spatially relative descriptors used herein interpreted accordingly.

The terminology used herein is for the purpose of describing particular embodiments only and is not intended to be limiting of the invention. As used herein, the singular terms "a," "an" and "the" are intended to include the plural forms as well, unless the context clearly indicates otherwise. For example, "a" polymer layer can mean more than one polymer layer unless a single layer is specifically noted. It will be further understood that the terms "includes" and/or "including," when used in this specification, specify the presence of stated features, integers, steps, operations, elements, and/or components, but do not preclude the presence and/or addition of one or more other features, integers, steps, operations, elements, components, and/or groups thereof.

Unless otherwise defined, all terms (including technical and scientific terms) used herein may have the same meaning as what is commonly understood by one of ordinary skill in the art. It will be further understood that terms, such as those defined in commonly used dictionaries, should be interpreted as having a meaning that is consistent with their meaning in the context of this specification and the relevant art and will not be interpreted in an idealized and/or overly formal sense unless expressly so defined herein. Further, all publications, patent applications, patents, and other references mentioned herein are incorporated by reference in their entirety.

Embodiments of the present invention are described with reference to plan views and cross-sectional illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated as a rectangle will, typically, have rounded or curved features. Thus, the regions illustrated in the figures are schematic in nature of a device and are not intended to limit the scope of the present invention.

Figure 4A:
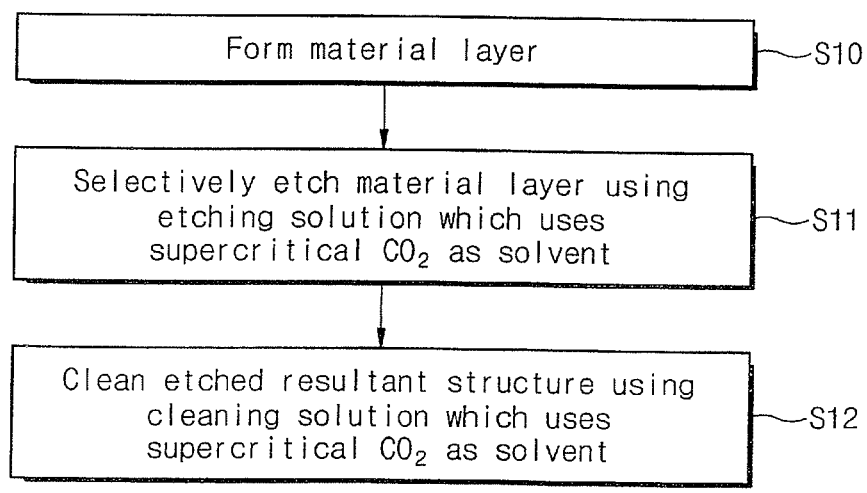

FIGS. 4A and 4B present process flow diagrams illustrating methods for etching and cleaning a material layer according to some embodiments of the present invention. Referring to FIG. 4A, a material layer is formed on a substrate (S10). The material layer is etched using a supercritical carbon dioxide ($CO_2$) in which an etching chemical is dissolved (S11), and then an etching by-product generated by a reaction between the material layer and the etching chemical is removed (S12).

According to some embodiments, the material layer may include a silicon oxide, e.g., tetraethylorthosilicate (TEOS) or borophosphosilicate glass (BPSG).

In some embodiments, the etching chemical includes fluoride, pyridine, or combinations thereof. Examples of fluorides include, but are not limited to, hydrofluoric acid (HF), hydrofluoroether (HFE), poly[4-vinylpyridinium poly(hydrogen fluoride)], hydrogen fluoride 2,4,6-trimethylpyridine and ammonium fluoride ($NH_4F$).

In some embodiments, the cleaning chemical includes sodium bis(2,2,3,3,4,4,5,5-octafluoro-1-pentyl)-2-sulfosuccinate (F-AOT), fluorine-based surfactants, alcohol, or combinations thereof. Examples of fluorine-based surfactants include, but are not limited to, those having a structure of $R_fCH_2CH_2SCH_2CH_2CO_2Li$, $(R_fCH_2CH_2O)P(O)(ONH_4)_2$ $(R_fCH_2CH_2O)_2P(O)(ONH_4)$, $(R_fCH_2CH_2O)P(O)(OH)_2$ $(R_fCH_2CH_2O)_2P(O)(OH)$, $R_fCH_2CH_2O(CH_2CH_2O)_xH$, $R_fCH_2CH_2O(CH_2CH_2O)_yH$, $R_fCH_2CH_2O(CH_2CH_2O)_yH$ and $R_fCH_2CH_2SO_3X$ (wherein $X=H$ or $NH_4$, $R_f=CF_3$ $(CF_2)_q$ or $CF_3(CF_2O)_q$, $x=2$ to 50, $y=2$ to 50, $q=2$ to 50). Examples of these surfactants include, but are not limited to, ZONYL®-FSA, ZONYL®-FSP, ZONYL®-FSE, ZONYL®-UR, ZONYL®-FSJ, ZONYL®-TBS, ZONYL®-FSN, ZONYL®-FSO, ZONYL®-FSD, and the like, manufactured by E.I. du Pont de Nemours and Company, U.S.A. Examples of suitable alcohols for the cleaning chemical include, but are not limited to, methanol, ethanol, isopropanol (IPA), propanol, and combinations thereof.

According to another embodiment of the present invention, as shown in FIG. 4B, the step of etching the material layer and the step of removing the etching by-product can be performed simultaneously (S13). In some embodiments, a supercritical carbon dioxide in which the etching chemical and the cleaning chemical are dissolved together is used for the etching and cleaning.

Furthermore, the aforementioned method using the supercritical carbon dioxide can be employed to etch and/or clean another type of material layer. The etching chemical and the cleaning chemical used for this purpose can be changed depending on the target material layer used.

Figure 5A:
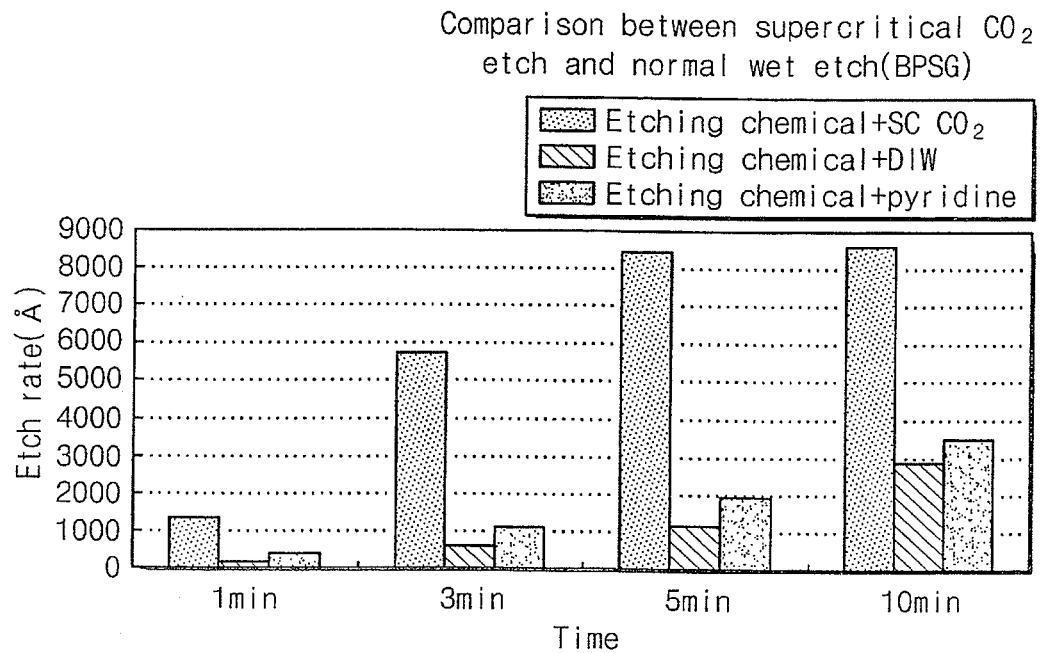
FIGS. 5A and 5B present experimental graphs showing results of the etch rate measured by etching methods using supercritical $CO_2$ and normal wet etch.
Figure 5B:
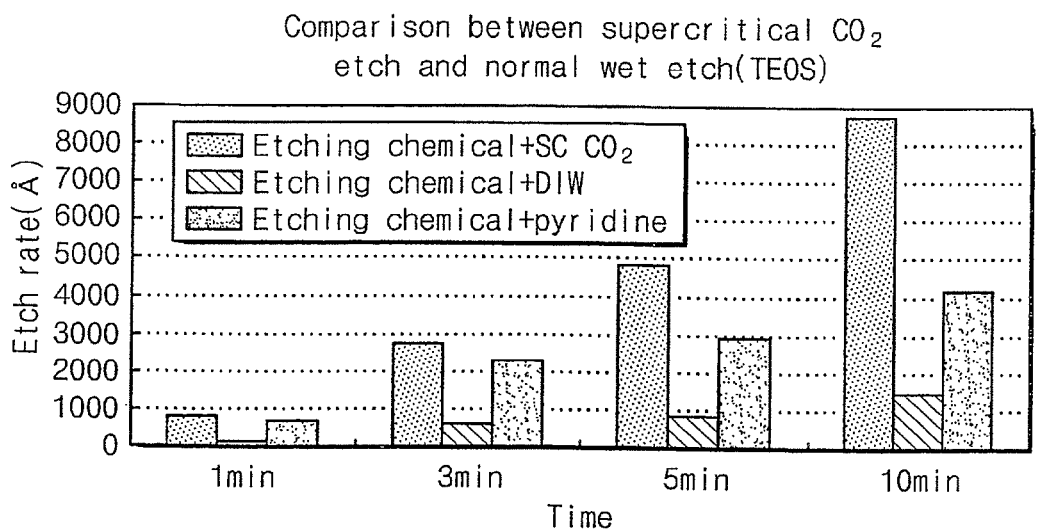

FIGS. 5A and 5B present experimental graphs showing results of the etch rate measured by etching methods according to the present invention. Specifically, FIGS. 5A and 5B present graphs showing etch rates measured on a BPSG layer and a TEOS layer respectively formed at a thickness of approximately 8500 Å on bare wafers. The etching chemicals used in the above experiments was a solution in which HF and pyridine were mixed at a volume ratio of 7:3. That is, the same etching chemical was used for the experiments. In the experiments, the etchings for the BPSG layer and the TEOS layer were performed at 70° C. using a solution in which the prepared etching chemical and a solvent were mixed at a volume ratio of 1:100. In the first experiment, supercritical carbon dioxide was used as the solvent, whereas in the second and third experiments (corresponding to the related art methods), de-ionized water and pyridine were used as the solvent.

Referring to FIG. 5A, it can be found that using supercritical carbon dioxide shows a three (3) to six (6) times faster etch rate than the methods using the de-ionized water and the pyridine. Also, in the etching experiment using the supercritical carbon dioxide, the etched amounts in the process times of 5 minutes and 10 minutes were almost identical.

Referring to FIG. 5B, it is demonstrated that the etching method using supercritical carbon dioxide etched the TEOS layer at a faster rate than the methods using the de-ionized water and the pyridine. The improvement in the etch rate is due, at least in part, to an increase in reaction speed obtainable because the $CO_2$ used as the solvent is in the supercritical state.

Figure 6A:
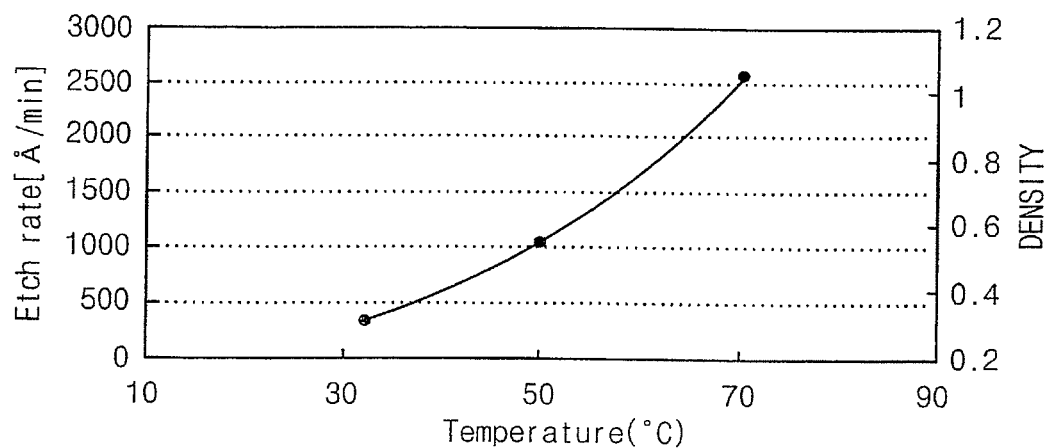
FIGS. 6A and 6B present graphs showing experimental results of the etch rate as a function of temperature.
Figure 6B:
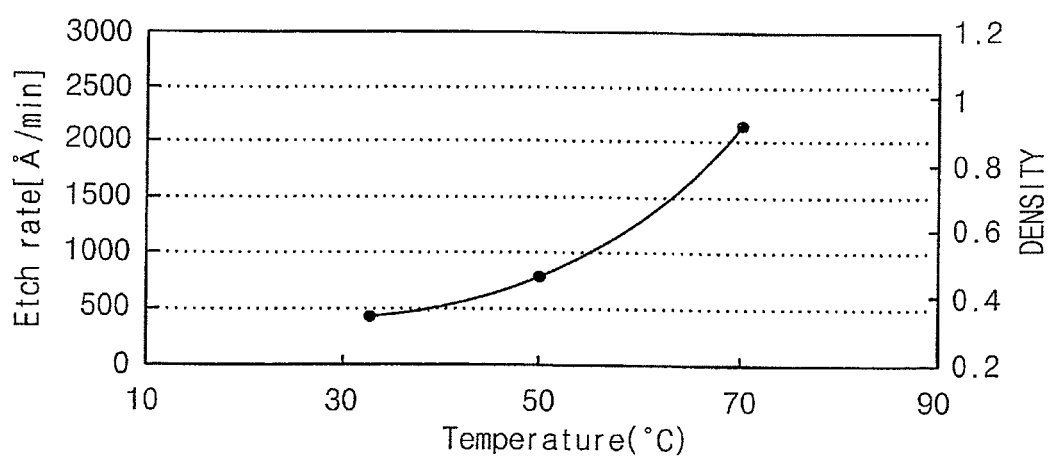

FIGS. 6A and 6B present graphs showing experimental results for evaluating a temperature condition in an etching process according to embodiments of the present invention. Specifically, FIGS. 6A and 6B present graphs showing the etch rates of a BPSG layer and a TEOS layer, respectively, measured at a fixed pressure of 2000 psi for 5 minutes at temperatures of 33, 50 and 70° C. The etching chemicals used in this experiment are the same as those used in the experiment described above with reference to FIGS. 5A and 5B.

Referring to FIGS. 6A and 6B, the etch rates of the BPSG layer and the TEOS layer increased as the process temperature was increased. Accordingly, the temperature range for the etching process in some embodiments of the present invention may be from about 31.1° C. (which is generally a critical temperature of $CO_2$) to about 100° C. Although not shown in the drawings, the etch rate at a process temperature above 70° C. was not particularly increased compared with the etch rate at 70° C. Therefore, in further embodiments, the temperature range for the etching process is from about 50° C. to 70° C.

Figure 7A:
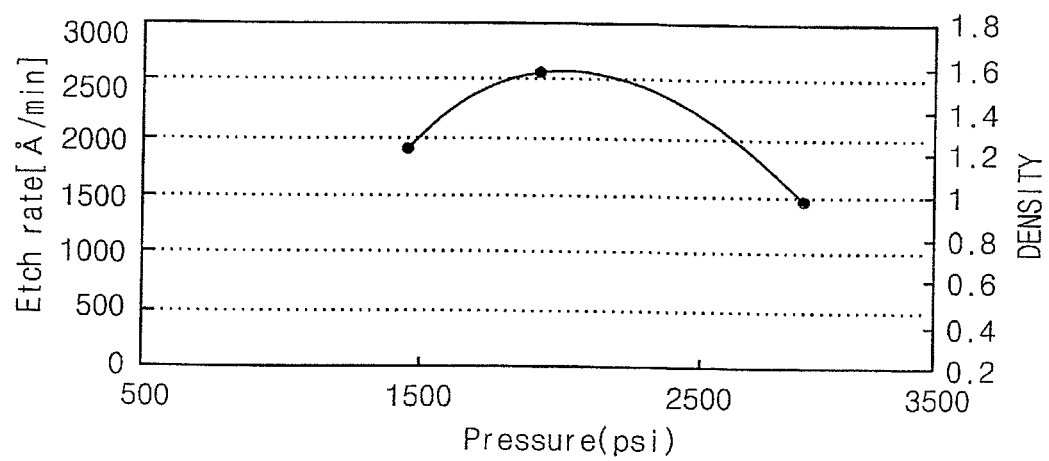
FIGS. 7A and 7B present graphs showing experimental results of the etch rate as a function of pressure.
Figure 7B:
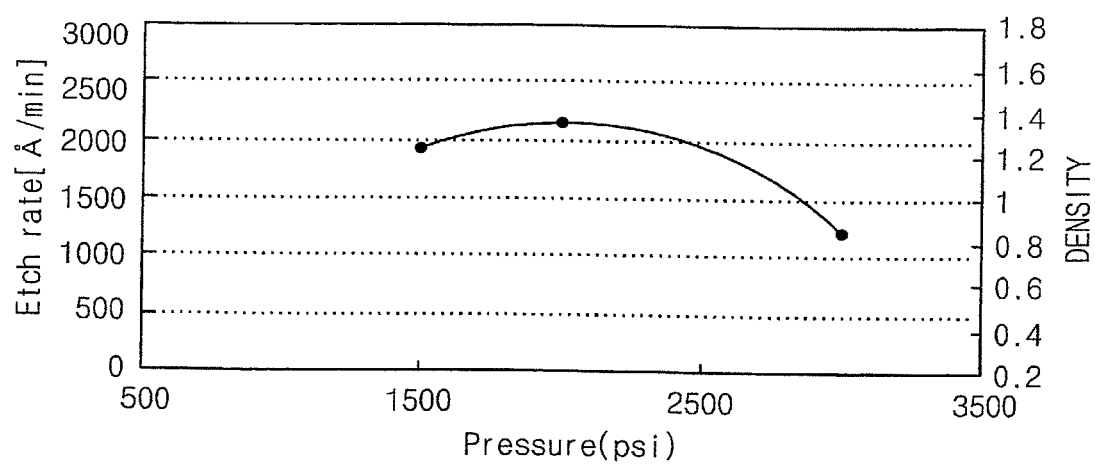

FIGS. 7A and 7B present graphs showing experimental results for evaluating the effects of pressure in an etching process according to some embodiments of the present invention. Specifically, FIGS. 7A and 7B present are graphs showing the etch rates of a BPSG layer and a TEOS layer, respectively, measured at pressures of 1500, 2000 and 3000 psi for 5 minutes at a temperature of 70° C. The etching chemicals used in these experiments are the same as those used in the experiments described above with reference to FIGS. 5A and 5B.

Referring to FIGS. 7A and 7B, it was found that the BPSG layer and the TEOS layer had the highest etch rate at a pressure of approximately 2000 psi. In this respect, in some embodiments, the pressure for the etching process is in a range of 1500 psi to 2500 psi. Alternatively, the pressure may be in a range of 1085 psi (which is a critical pressure of carbon dioxide) to 4000 psi.

Figure 8A:
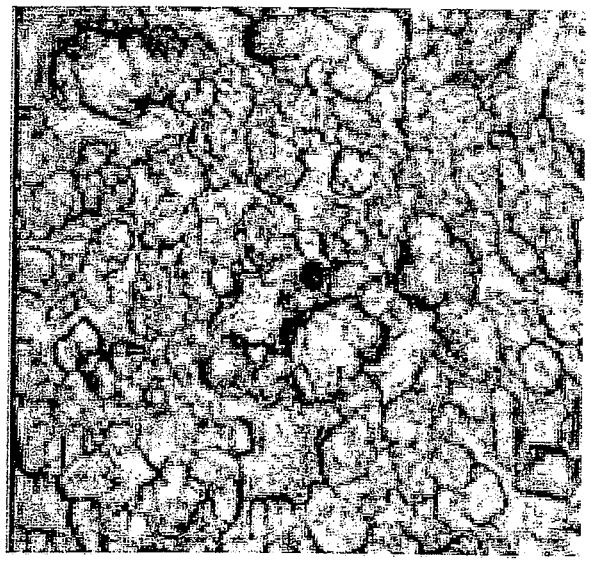
FIGS. 8A and 8B present photographs showing etching by-products on a substrate generated in an etching process.
Figure 8B:
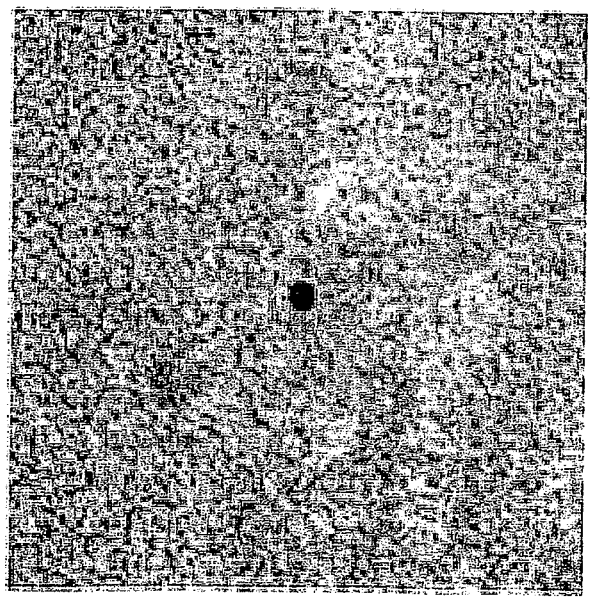

In some embodiments, the aforementioned etching method of the present invention can be used for a process of manufacturing a capacitor constituting a unit cell of a DRAM device. As shown in FIGS. 8A and 8B, after the etching step, etching by-products, which are presumed to be generated from a reaction between the etching chemicals and the silicon oxide, may be left on a substrate (or bare substrate). These etching by-products can be removed by a cleaning solution that includes de-ionized water. However, as previously described, because this cleaning solution causes these capacitors having a large aspect ratio to lean, its use is limited. The cleaning method according to some embodiments of the present invention provides a solution to the leaning problem by making use of compositions that include a supercritical solvent.

Figure 9A:
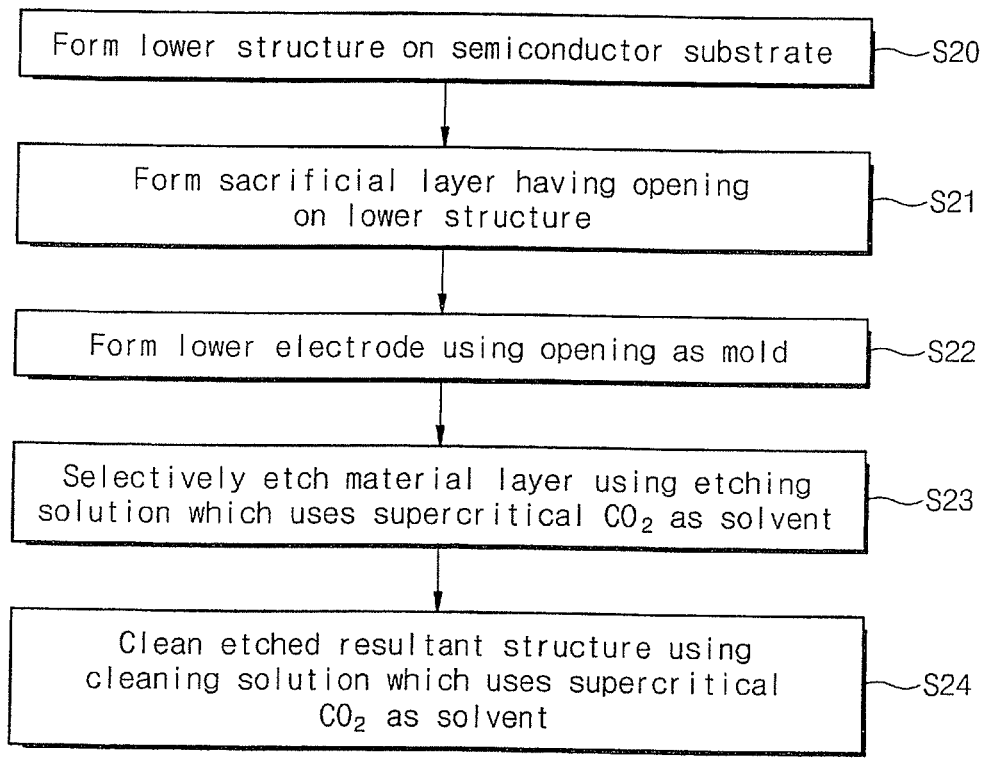
FIGS. 9A and 9B present process flow diagrams illustrating methods of manufacturing a DRAM device using etching and cleaning processes according to some embodiments of the present invention.
Figure 9B:
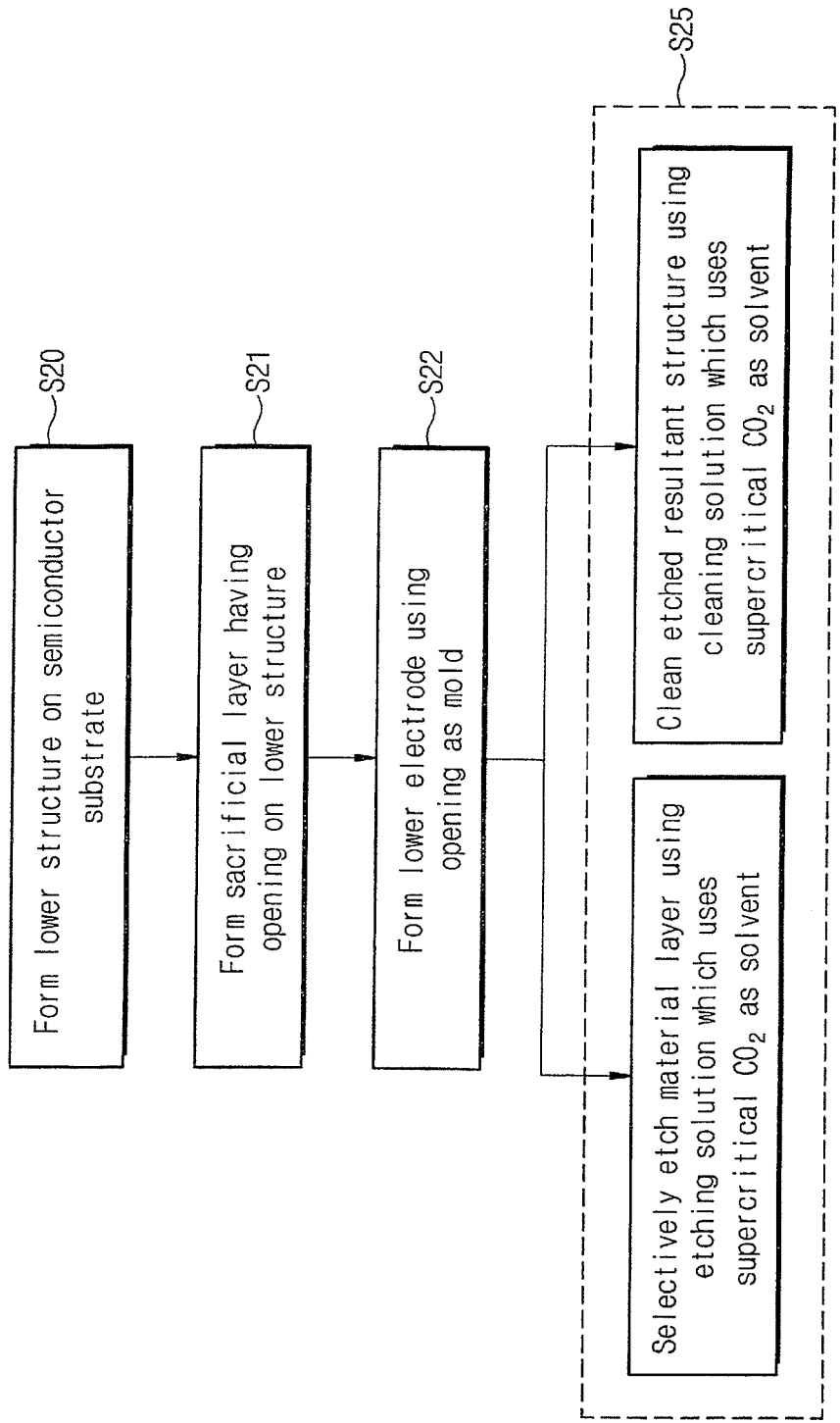

FIGS. 9A and 9B present flow diagrams illustrating methods of manufacturing a DRAM capacitor using etching and cleaning processes according to some embodiments of the present invention. The methods illustrated in FIGS. 9A and 9B are the same as the aforementioned method illustrated with reference to FIG. 2, except for the steps of etching and cleaning the sacrificial layers 60 and 80, and therefore, repeated description of similar steps will be omitted for simplicity of discussion.

Figure 2:
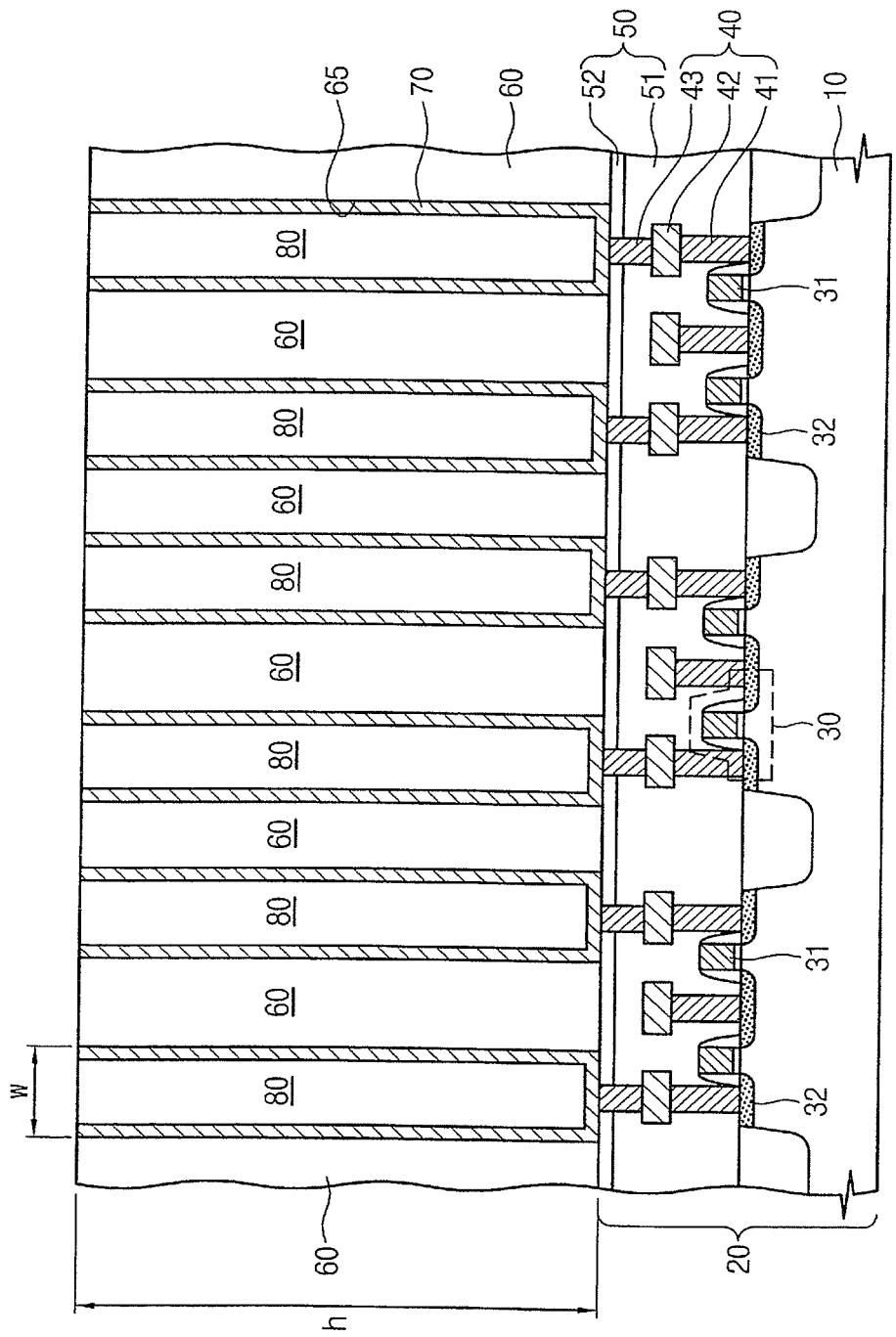
FIG. 2 presents a sectional view of memory cells of a conventional DRAM device.
Figure 3:
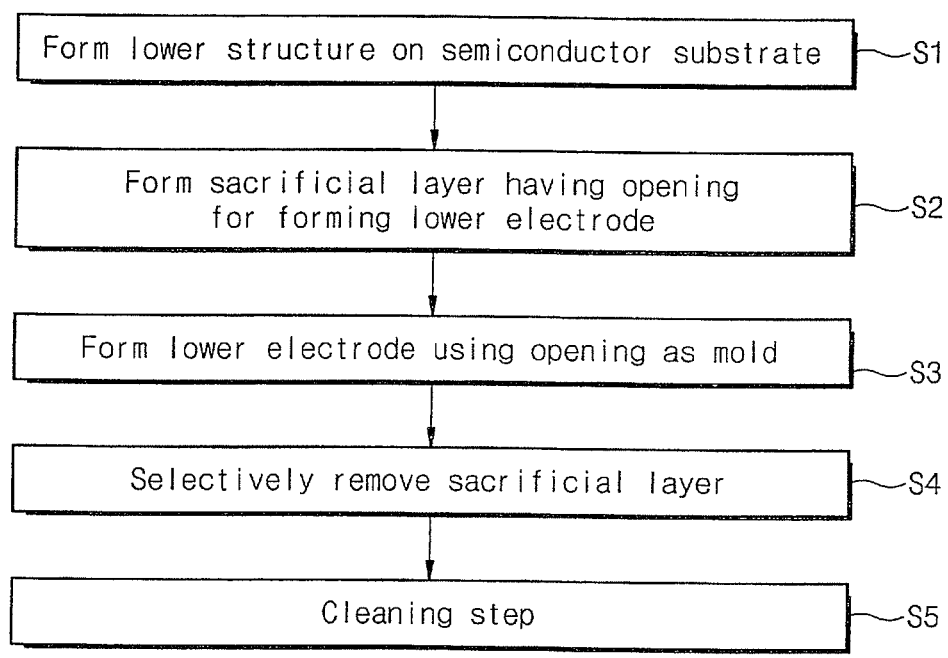
FIG. 3 presents a process flow diagram illustrating a method of manufacturing a DRAM device according to the related art.

Referring to FIGS. 2 and 9A, a lower structure 20 is formed on a semiconductor substrate 10 (S20), and then a first sacrificial layer 60 having openings 65 is formed on the lower structure 20 (S21). The lower electrode 70 is then formed by using the openings 65 as a mold (S22). In some embodiments, the openings 65 on which the lower electrode 70 is formed can be filled with a second sacrificial layer 80.

Thereafter, in some embodiments, the first and second sacrificial layers 60 and 80 are selectively etched using a supercritical carbon dioxide in which etching chemicals are dissolved (S23). In further embodiments, etching by-products generated from a reaction between the first and second sacrificial layers 60 and 80 and the etching chemicals can be removed using a supercritical carbon dioxide in which cleaning chemicals is dissolved (S24).

According to some embodiments of the present invention, the first and second sacrificial layers 60 and 80 are silicon oxides. Examples of suitable silicon oxides include, but are not limited to, tetraethylorthosilicate (TEOS), borophosphosilicate glass (BPSG), spin-on-glass (SOG), and combinations thereof. In some embodiments, the etching chemicals include fluoride, pyridine ($C_5H_5N$), or mixtures thereof, and the cleaning chemicals include F-AOT (sodium bis(2,2,3,3,4,4,5,5-octafluoro-1-pentyl)-2-sulfosuccinate), fluorine-based surfactants alcohol, or mixtures thereof.

In some embodiments, the fluoride used for the etching chemical may be at least one of hydrofluoric acid (HF), hydrofluoroether (HFE), poly[4-vinylpyridinium poly(hydrogen fluoride)], hydrogen fluoride 2,4,6-trimethylpyridine or ammonium fluoride ($NH_4F$). Also, in further embodiments, the surfactant for the etching chemicals may include a block copolymer to which a compound is bonded, e.g., fluorine-based ionic or non-ionic compounds, hydrophilic compounds, hydrophobic fluorine-based polymer compounds, or mixtures/combinations thereof. In some embodiments, the fluorine-based ionic or non-ionic compounds may be materials having a chemical structure of $R_fCH_2CH_2SCH_2CH_2CO_2Li$, $(R_fCH_2CH_2O)P(O)(ONH_4)_2$ $(R_fCH_2CH_2O)_2P(O)(ONH_4)$, $(R_fCH_2CH_2O-)P(O)(OH)_2$ $(R_fCH_2CH_2O)_2P(O)(OH)$, $R_fCH_2CH_2O(CH_2CH_2O)_xH$, $R_fCH_2CH_2O(CH_2CH_2O)_yH$, $R_fCH_2CH_2O(CH_2CH_2O)_yH$ or $R_fCH_2CH_2SO_3X$ (wherein X=H or $NH_4$, $R_f$=$CF_3(CF_2)_q$ or $CF_3(CF_2O)_q$, x=2 to 50, y=2 to 50, q=2 to 50). These may be fluorine-based surfactants manufactured by E.I. du Pont de Nemours and Company, U.S.A. (ZONYL®). Also, in some embodiments the hydrophilic compound may be at least one selected from the group consisting of a polyethylene oxide (PEO) chain and polypropylene oxide (PPO), and the hydrophobic fluorine-based polymer compound may be poly(fluorooctyl methacrylates) (PFOMA). According to an embodiment of the present invention, the fluoride for the etching chemicals may be a fluorine-based block copolymer one example of which may be PEO-block-PFOMA (polyethylene oxide-block-poly(fluorooctyl methacrylate) (poly(ethylene oxide)-b-poly(1,1'-dihydroperflurooctyl methacrylate) shown below in Formula 1. In addition, in some embodiments, the fluoride for the etching chemicals may be a block copolymer to which the hydrophilic PEO and the hydrophobic PFOMA are bonded in AB or ABA structure. In some embodiments, A may be PEO and B may be PFOMA.

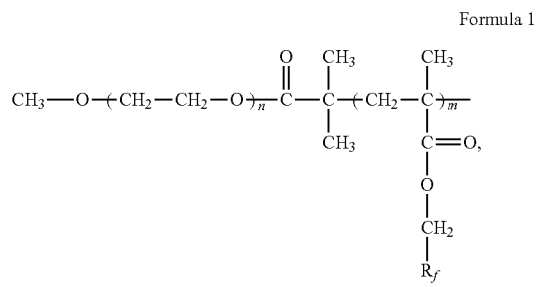

Formula 1 where $R_f$=$CF_3(CF_2)_q$ or $CF_3(CF_2O)_q$, m=2 to 50, n=2 to 50, q=2 to 50.

In some embodiments, the fluorine-based surfactants that may be used as the cleaning chemicals may be materials having a chemical structure of $R_fCH_2CH_2SCH_2CH_2CO_2Li$, $(R_fCH_2CH_2O)P(O)(ONH_4)_2$ $(R_fCH_2CH_2O)_2P(O)(ONH_4)$, $(R_fCH_2CH_2O)P(O)(OH)_2$ $(R_fCH_2CH_2O)_2P(O)(OH)$, $R_fCH_2CH_2O(CH_2CH_2O)_xH$, $R_fCH_2CH_2O(CH_2CH_2O)_yH$, $R_fCH_2CH_2O(CH_2CH_2O)_yH$ or $R_fCH_2CH_2SO_3X$ (X=H or $NH_4$, $R_f$=$CF_3(CF_2)_q$ or $CF_3(CF_2O)_q$, x=2 to 50, y=2 to 50, q=2 to 50). These may be fluorine-based surfactants manufactured by E. I. du Pont de Nemours and Company, U.S.A. (ZONYL®). According to another embodiment of the present invention, the fluorine-based surfactant for use as the cleaning chemicals may be a block copolymer, for example, PEO-block-PFOMA (polyethylene oxide-block-poly fluorooctyl methacrylate) (Formula 1) to which hydrophilic compounds and/or hydrophobic fluorine-based polymer compounds are chemically bonded. Examples of alcohol used for the cleaning chemical include, but are not limited to, methanol, ethanol, isopropanol (IPA), propanol, and combinations thereof.

As aforementioned, in some embodiments, the etching and cleaning steps (S23, S24) are performed at a temperature of about 70° C. and at a pressure of about 2000 psi. Also, in further embodiments, the etching chemicals are dissolved in the supercritical carbon dioxide in an amount of about 0.01% by weight to 10% by weight.

In some embodiments, after the cleaning step (S23) is performed, a step of drying a structure resulting from the cleaning step (S23) may be performed. The drying step can include a step of lowering the temperature of a process chamber into which the cleaned resultant structure is loaded to a temperature below the critical point of carbon dioxide. In this case, the supercritical carbon dioxide can be discharged in a gas state to the outside of the process chamber.

Figure 10:
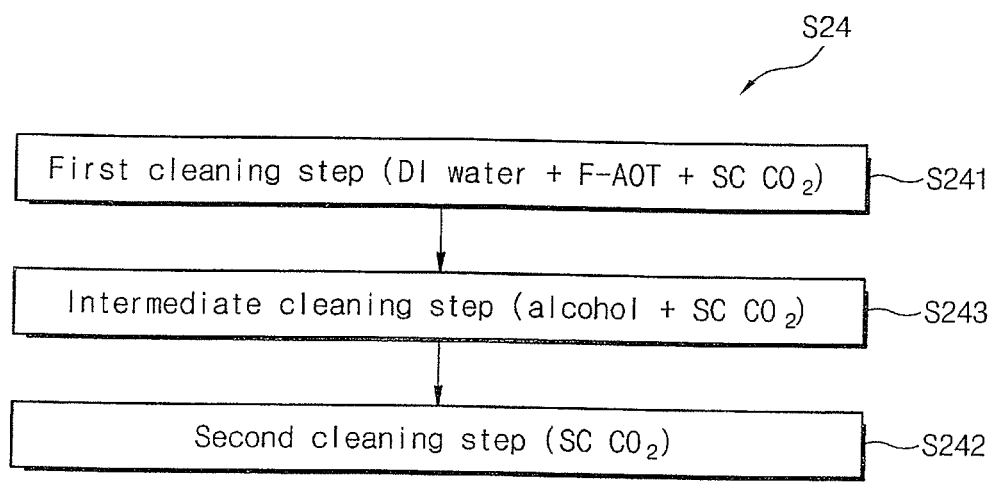
FIG. 10 presents a process flow diagram illustrating a cleaning process according to further embodiments of the present invention.

According to further embodiments of the present invention, the cleaning step (S24) can be divided into a first cleaning step (S241) and a second cleaning step (S242) as shown in FIG. 10. In the first cleaning step (S241), de-ionized (DI) water and F-AOT (Formula 2) may be used as the cleaning chemicals, and the second cleaning step (S242) may use only the supercritical carbon dioxide. In some embodiments, the ratios by weight of the DI water and the F-AOT used in the first cleaning step (S241) are in the range of about 0.01 wt % to 5 wt % and about 0.01 wt % to 10 wt %. In some embodiments, the DI water used in the first cleaning step (S241) is bonded to F-AOT to at least increase the efficiency of cleaning to remove the etching by-products.

Formula 2

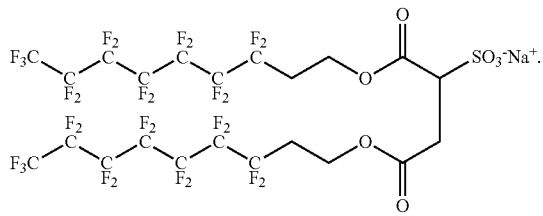

According to another embodiment of the present invention, an intermediate cleaning step (S24) including alcohol as a cleaning chemical can be further performed between the first and second cleaning steps (S241 and S242). Examples of alcohols used in the intermediate cleaning step (S243) include, but are not limited to, ethanol, isopropanol (IPA), propanol, and mixtures thereof, and in some embodiments the alcohol is provided in a ratio by weight ranging from 0.01 wt % to 50 wt %.

According to another embodiment of the present invention, the etching step (S23) and the cleaning step (S24) can be performed simultaneously using a supercritical carbon dioxide in which the aforementioned etching chemical and the cleaning chemical are dissolved together (S25).

Figure 11:
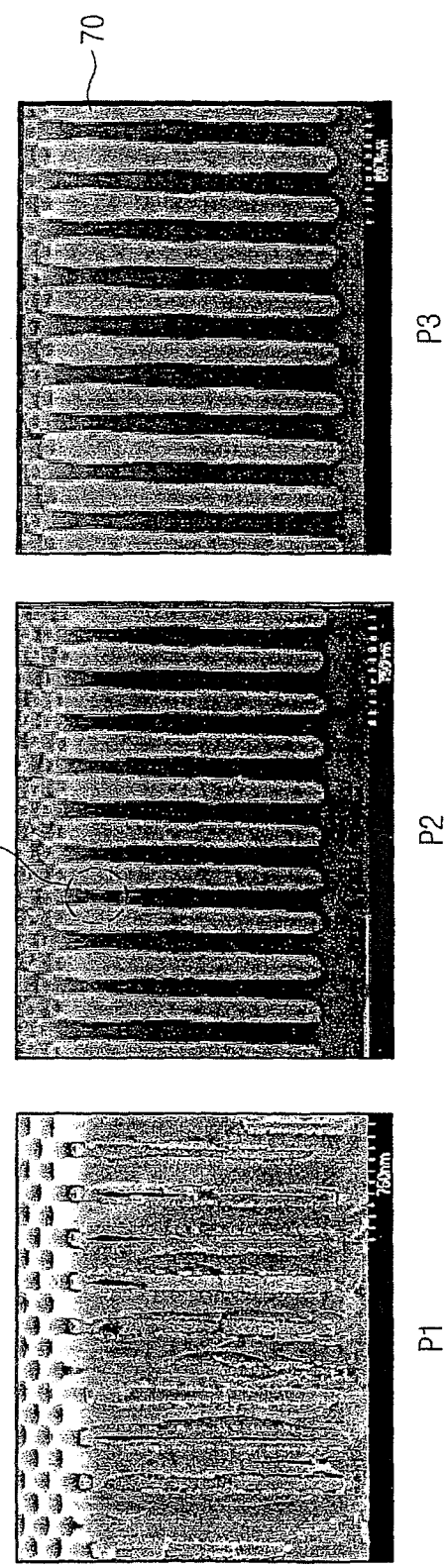
FIG. 11 presents photographs of a DRAM device formed according to some embodiments of the present invention. P1 shows a first resultant structure in which the lower electrodes (70) are formed. P2 shows a second resultant structure obtained by etching the first resultant structure prior to cleaning. Etching by-products (99) are found on the surfaces of the lower electrodes (70). P3 shows a third resultant structure after cleaning. The surfaces of the lower electrodes (70) are exposed and cleaned without causing the electrodes to lean.

The photographs presented in FIG. 11 show the results of the aforementioned cleaning process according to some embodiments of the present invention. Referring to FIG. 11, the left photograph (P1) shows a resultant structure (hereinafter referred to as "first resultant structure") in which the lower electrodes 70 are formed, and the middle photograph (P2) shows a resultant structure (hereinafter referred to as "second resultant structure") obtained by etching the first resultant structure using some embodiments of the aforementioned etching method. The middle photograph (P2) corresponds to a photograph of a resultant structure before the cleaning process according to some embodiments of the present invention is performed. As shown in the photograph, etching by-products 99 can be found on surfaces of the lower electrodes.

The right photograph (P3) shows a resultant structure (hereinafter referred to as "third resultant structure") after the cleaning process is performed according to some embodiments of the present invention. As shown in the right photograph, the etching by-products 99 have been removed from the surfaces of the lower electrodes 70. Also, due, at least in part, to the low surface tension of the aforementioned compositions including supercritical carbon dioxide, the surfaces of the lower electrodes 70 are exposed with no or minimal leaning problem of the lower electrodes 70.

Figure 12:
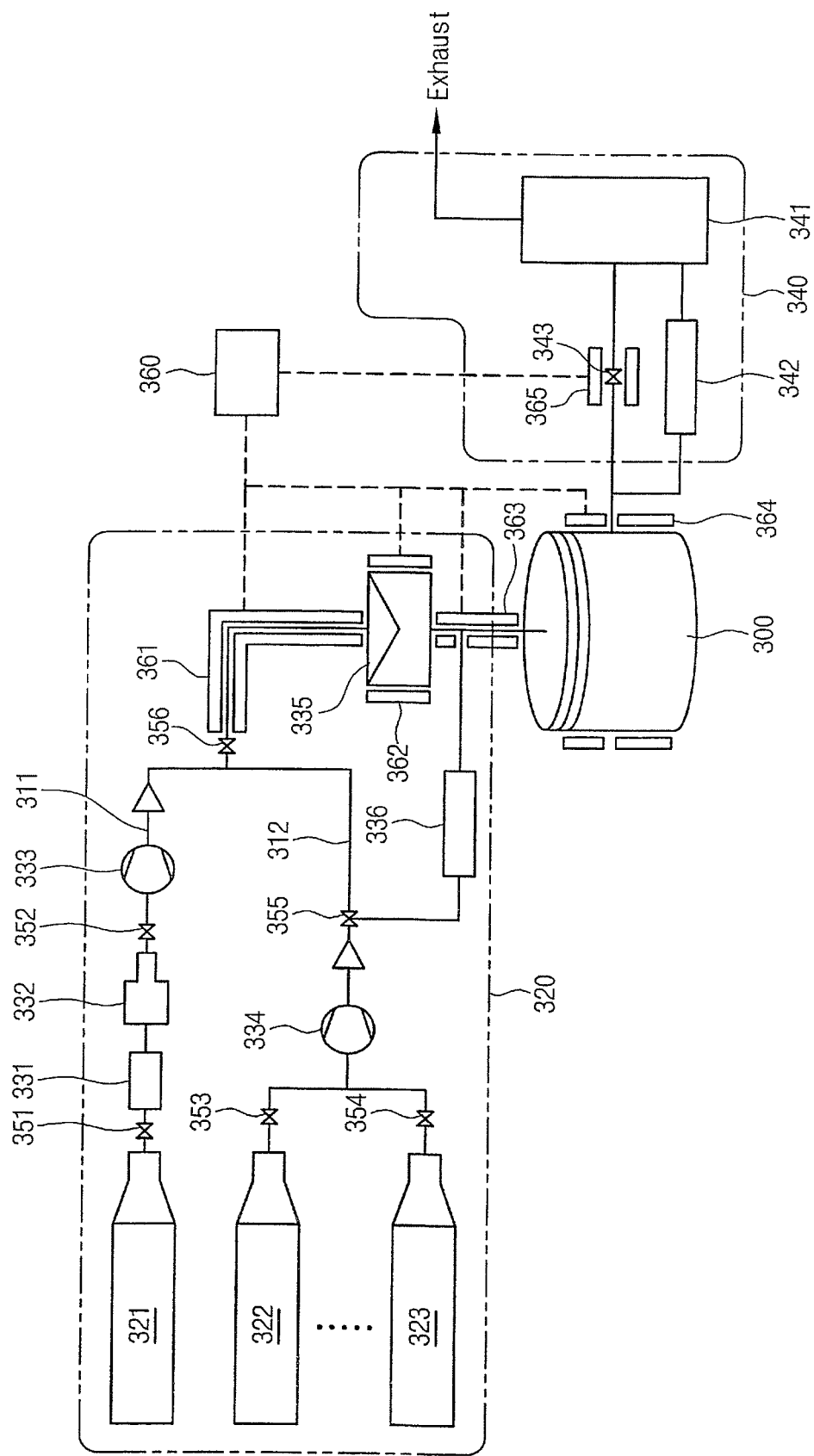
FIG. 12 presents a device scheme of a chamber system for etching and cleaning processes according to some embodiments of the present invention.

FIG. 12 presents a device scheme of a chamber system for etching and cleaning processes according to some embodiments of the present invention. Referring to FIG. 12, a chamber system according to some embodiments of the present invention includes a process chamber 300, a supplying unit 320 and a discharging unit 340. A substrate on which a material layer is formed is loaded into the process chamber 300. The supplying unit 320 supplies the process chamber 300 with etching fluid for etching the material layer and/or cleaning fluid for removing etching by-products in a supercritical state. The discharging unit 340 discharges the etching fluid and the cleaning fluid used from the process chamber 300 to the outside of the process chamber 300. In some embodiments, the etching fluid and the cleaning fluid include etching chemicals and cleaning chemicals that are dissolved in a supercritical solvent, and in some embodiments, the supercritical solvent is carbon dioxide.

According to further embodiments of the present invention, while the step of etching the material layer and the step of removing the etching by-products are performed, the process chamber 300 is kept at a temperature above the critical temperature and at a pressure above the critical pressure. Therefore, the etching step and the cleaning step can be successively performed while maintaining the supercritical state of the solvent.

In some embodiments, the supplying unit 320 is provided with a first container 321 containing a solvent, and second and third containers 322 and 323 containing a co-solvent including the etching chemical and the cleaning chemical. More or fewer containers may be provided as desired. According to some embodiments of the present invention, the solvent can be carbon oxide and the etching chemical can be fluoride, pyridine ($C_5H_5N$), or mixtures thereof. Also, in further embodiments, the cleaning chemical may be F-AOT, fluorine-based surfactants, de-ionized (DI) water, alcohol, or combinations thereof. In some embodiments, the etching chemicals and the cleaning chemicals used may include those described with reference to FIG. 9A.

According to some embodiments of the present invention, a booster pump 331 for safely supplying the solvent at a constant flow, and a temperature controller (e.g., cooler) 332 for easily pressurizing the solvent are disposed between the first container 321 and the process chamber 300. A first pressure pump 333 for elevating the pressure of the solvent above the critical pressure is disposed between the temperature controller 332 and the process chamber 330, and a mixer 335 for mixing the solvent with the co-solvent is disposed between the first pressure pump 333 and the process chamber 300. In some embodiments, the mixer 335 precisely regulates the amount of the fluid introduced into the process chamber 300.

For this purpose, the second and third containers 322 and 323 are connected via a second pipe 312 to the mixer 335. On the second pipe 312, a second pressure pump 334 for elevating the pressure of the co-solvent may be disposed as shown in the figure. Also, the booster pump 331, the temperature controller 332 and the first pressure pump 333 are disposed on a first pipe 311 connecting the first container 321 and the mixer 335.

In some embodiments, the etching fluid wherein the solvent and the etching chemical are mixed is supplied to the mixer 335 and the process chamber 300 during the etching step, and then the cleaning fluid wherein the solvent and the cleaning chemical are mixed is supplied during the cleaning step. This sequential fluid supply is performed while maintaining the solvent at a temperature and pressure above the critical point as described above. For this purpose, as shown in the figures, in some embodiments, valves 351 to 356 for regulating the supplies of the solvent and the co-solvent can be disposed on the pipes (e.g., first pipe 311 and second pipe 312) connecting the process chamber 300 and the containers 321 to 323. In addition, for the maintenance of this condition, a controller (not shown) for controlling the operations of the valves 351 to 356, the booster pump 331, the temperature controller 332, the first and second pressure pumps 333 and 334, and the mixer 335 can be further disposed in some embodiments. The operations of the discharging unit 340 may also be controlled by the controller.

In some embodiments, the discharging unit 340 is provided with a separator 341 for separating a solvent and harmful chemicals (e.g., the etching chemicals and/or cleaning chemicals) from the fluid discharged from the process chamber 300. For this separation, a basic material for neutralizing the etching chemical can be supplied to the separator 341. In further embodiments, between the separator 341 and the process chamber 300 is further disposed a discharge valve 343 controlled by the controller. Furthermore, according to some embodiments of the present invention, a rupture disk 342 can be connected to the process chamber 300 for preventing a pressurized solvent from being abruptly discharged from the process chamber 300. Meanwhile, for the enhancement of productivity, in some embodiments, all or parts of the elements mentioned above are electronically controlled by a controller.

In some embodiments, the pressure and temperature of the solvent are kept above the critical point as described above to maintain the solvent in a supercritical state. In further embodiments, the above-described chamber system may be provided with a temperature measuring unit, pressure measuring unit, temperature controlling unit and/or pressure controlling unit capable of monitoring and/or controlling the temperature and pressure of the fluid used. For example, in some embodiments, first to fifth temperature control jackets 361 to 365 controlled by the temperature controlling unit are disposed around a pipe connected to the mixer 335, a pipe between the process chamber 300 and the mixer 335, the process chamber 300 and the discharge valve 343.

According to some embodiments of the present invention, the chamber system can be utilized for the step of drying a water-soluble chemical as well as for the steps of etching and cleaning the material layer. In some embodiments, a common solvent for this purpose is stored in the second and third containers 322 and 323. The common solvent for drying according to some embodiments of the present invention will be described below, and in some embodiments, is similar to that of previous embodiments except for a difference in the type of chemical.

Figure 13:
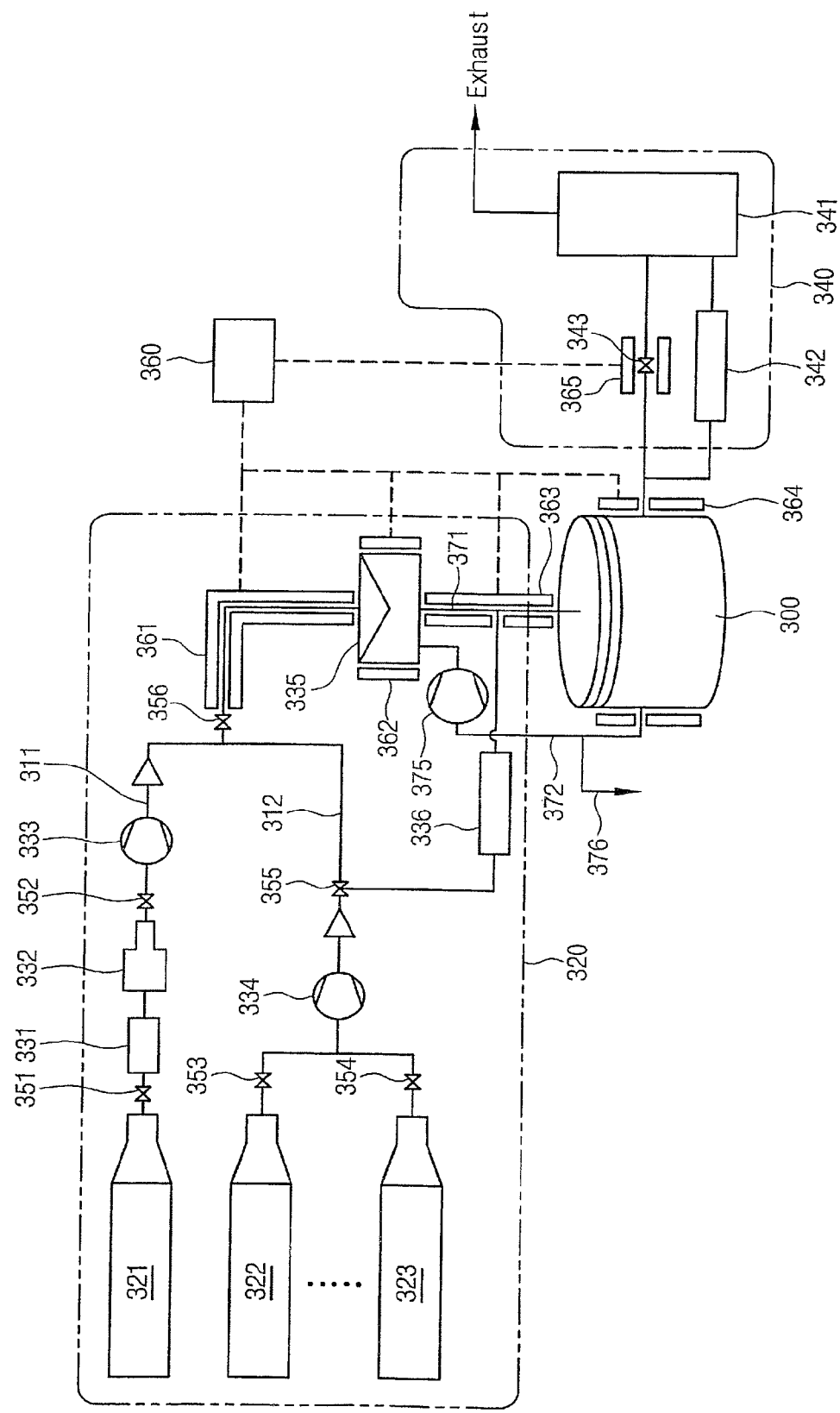
FIG. 13 presents a device scheme of a chamber system according to other embodiments of the present invention.

FIG. 13 presents a device scheme of a chamber system according to another embodiment of the present invention. The chamber system shown in FIG. 13 is similar to that of the embodiments described with reference to FIG. 12. Accordingly, for the simplicity of description, repeated description of the overlapping elements will be omitted.

Referring to FIGS. 12 and 13, the chamber system according to some embodiments includes a circulation pipe which can circulate a supercritical fluid between the mixer 335 and the process chamber 300. In some embodiments, the circulation pipe includes a first circulation pipe 371 which delivers the supercritical fluid prepared in the mixer 335 to the process chamber, and a second circulation pipe 372 which delivers the supercritical fluid used in the process chamber 300 to the mixer 335. For the circulation of this supercritical fluid, in further embodiments, a circulation pump 375 is further provided on the circulation pipe. The circulation pump 375 can be disposed on, for example, the first circulation pipe 371 or the second circulation pipe 372.

In addition, in some embodiments, a vent portion 376 for discharging at least a portion of the used supercritical fluid can be connected, e.g., onto the second circulation pipe 372. Upon discharging at least a portion of the used supercritical fluid through the vent portion 376, the supercritical fluid can be additively supplied to the mixer 335. Therefore, in some embodiments, it is possible to perform a selected process using the supercritical fluid having a substantially uniform purity without a substantial pressure variation in the inside of the process chamber 300.

Figure 14:
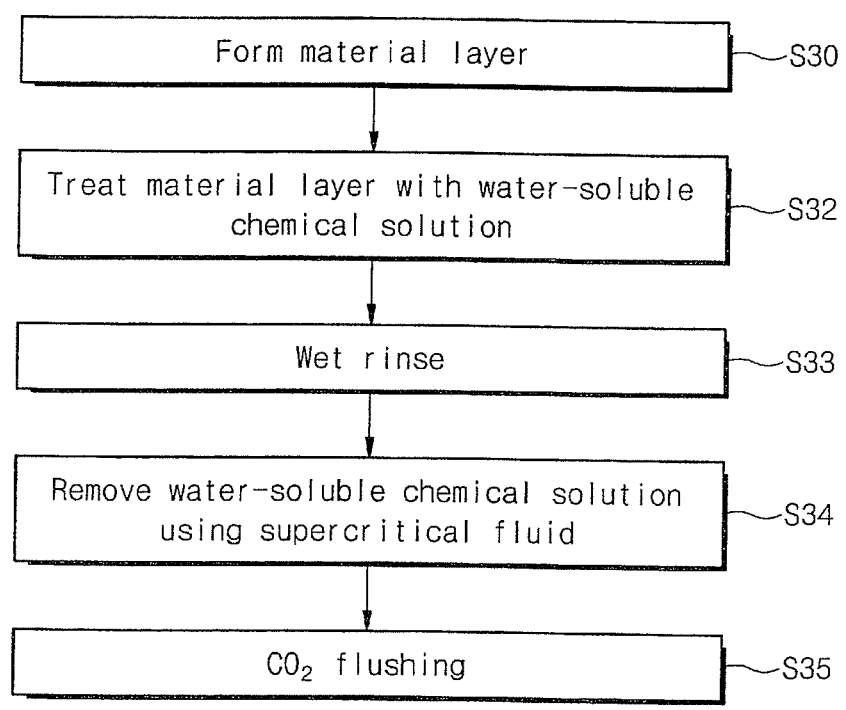
FIG. 14 presents a process flow diagram for illustrating a drying process according to further embodiments of the present invention.

FIG. 14 presents a process flow diagram for illustrating a drying process according to some embodiments of the present invention. Referring to FIG. 14, the drying step according to some embodiments includes the step (S30) of forming a material layer, the step (S32) of treating the material layer with a water-soluble chemical and the step (S34) of removing the water-soluble chemical using a supercritical fluid. According to further embodiments of the present invention, the step (S33) of rinsing the material layer, which has been treated with the water-soluble chemical, using, e.g., IPA, HFE, or mixtures thereof, may be further provided before the step (S34) of removing the water-soluble chemical using a supercritical fluid. In addition, in some embodiments, the step (S35) of flushing a resultant structure from which the water-soluble chemical has been removed, using a supercritical carbon dioxide may be further provided after the step (S34) of removing the water-soluble chemical using a supercritical fluid.

According to some embodiments of the present invention, the step (S32) of treating the material layer may be any one of, e.g., the steps of etching the material layer using a predetermined etchant, cleaning the material layer using a predetermined cleaning solution, and pre-cleaning the material layer using a predetermined cleaning solution before forming a new layer on the material layer. In some embodiments, the material layer can be, e.g., a silicon oxide used as a mold layer for forming a lower capacitor electrode of a DRAM, or a conductive material (e.g., Si, TiN, Ti, W, Ru, Ir or the like) used as the lower capacitor electrode of the DRAM. In the case of etching a silicon oxide layer, in some embodiments, the water-soluble chemical used in the step (S32) of treating the material layer can be a chemical substance containing de-ionized (DI) water and fluorine dissolved in DI water.

In other embodiments, the step (S32) of treating the material layer includes the step of dipping the resultant structure on which the material layer is formed into the water-soluble chemical. In further embodiments, the dipping step includes a drying step of removing the water-soluble chemical used. However, when the lower capacitor electrode of the DRAM having a high aspect ratio is dried using a conventional method, this action may cause a leaning problem, as aforementioned. However, by employing the drying method provided in the present invention which removes the water-soluble chemical using the supercritical fluid, the leaning problem may be overcome with the low viscosity and/or surface tension of the supercritical fluid.

In some embodiments, the supercritical fluid used in the step (S34) of removing the water-soluble chemical can include a supercritical carbon dioxide and a surfactant. Examples of suitable surfactants include, but are not limited to, a TMN-based surfactant, a fluorine-based surfactant having a branch, a surfactant containing a fluorine block copolymer, or combinations thereof. According to some embodiments of the present invention, the TMN-based surfactant can be TMN-10, which is expressed by Formula 3:

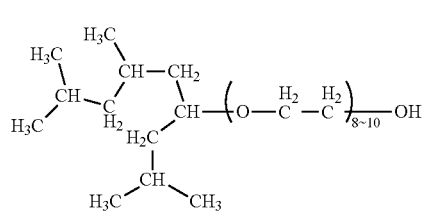

Formula 3

In some embodiments, the branched fluorine-based surfactant can include materials having a chemical structure of $R_fCH_2CH_2SCH_2CH_2CO_2Li$, $(R_fCH_2CH_2O)P(O)(ONH_4)_2$ $(R_fCH_2CH_2O_2P(O)(ONH_4))$, $(R_fCH_2CH_2O)P(O)(OH)_2$ $(R_fCH_2CH_2O)_2P(O)(OH)$, $R_fCH_2CH_2O(CH_2CH_2O)_xH$, $R_fCH_2CH_2O(CH_2CH_2O)_yH$, $R_fCH_2CH_2O(CH_2CH_2O)_yH$, $R_fCH_2CH_2SO_3X$ (wherein X=H or $NH_4$, $R_f$=$CF_3(CF_2)_q$ or $CF_3(CF_2O)_q$, x=2 to 50, y=2 to 50, q=2 to 50), or combinations thereof. Alternatively, the branched fluorine-based surfactant may be F-AOT, which is expressed by Formula 2. In some embodiments, the surfactant containing the fluorine block copolymer may be a block copolymer (e.g., PEO-block-PFOMA (Poly ethylene oxide-block-poly fluorooctyl methacrylate) expressed by Formula 1 to which hydrophilic compounds, hydrophobic fluorine-based polymer compounds, or mixtures thereof are chemically bonded.

The PEO-block-PFOMA is non-ionic, is stable in acidic compositions, and is useful in removing a water-soluble solution in which approximately 120 water molecules are bonded to one surfactant molecule. The drying characteristics using the supercritical carbon dioxide containing the PEO-block-PFOMA were tested by the inventors. The experiment was performed by etching a molded oxide layer to form lower capacitor electrodes using a buffered oxide etchant (BOE) at 25° C., rinsing the resultant structure using DI water at 25° C., removing the DI water using the supercritical carbon dioxide containing the PEO-block-PFOMA at 40° C., and measuring the amount of the remaining DI water. The removal efficiency of DI water by the supercritical carbon dioxide containing the PEO-block-PFOMA approached approximately 100%, and the supercritical carbon dioxide containing the PEO-block-PFOMA showed an improved removal effect compared to other known compounds.

As described above, the etching and cleaning steps according to some embodiments of the present invention are performed using a supercritical fluid. Owing to at least a high reactivity of the supercritical fluid, the etching process according to some embodiments of the present invention has an improved efficiency. Also, because, at least in part, due to the low surface tension of the supercritical fluid, the etching processes according to some embodiments of the present invention can prevent the lower electrodes from leaning during a manufacturing process of a capacitor constituting a memory cell of a DRAM device and can also remove etching by-products.

The above-disclosed subject matter is to be considered illustrative, and not restrictive, and the appended claims are intended to cover all such modifications, enhancements, and other embodiments, which fall within the true spirit and scope of the present invention as defined by the following claims.

What is claimed is:

1. A semiconductor processing apparatus, comprising:
a process chamber configured to accept a substrate for processing; and
a supercritical material supplying unit configured to supply a first material in a supercritical condition to the process chamber, the supercritical material supplying unit comprising
a first fluid path to provide the first material from a first source to the process chamber;
a first pressure pump within the first fluid path;
a second fluid path to provide a second material from a second source to the process chamber, the second fluid path disposed between the second source and a first location along the first fluid path upstream of the process chamber to provide a mixture of the first material and the second material downstream of the first location;
a first regulator disposed in the first fluid path between the first location and the process chamber, configured to regulate an amount of a mixture of the first material and the second material introduced into the process chamber; and
a first temperature control jacket disposed around at least a portion of the first fluid path between the first location and the first regulator,
wherein the first pressure pump and the first temperature control jacket are configured to maintain temperature and pressure of the mixture of the first material and the second material so that the first material is above a critical point.

2. The apparatus of claim 1, further comprising a temperature controller positioned in the first fluid path between the source and the first pressure pump.

3. The apparatus of claim 1, further comprising:
a mixer, the mixer comprising the first regulator; and
a third fluid path between the process chamber and the mixer, the third fluid path configured to deliver supercritical material within the process chamber to the mixer.

4. The apparatus of claim 3, further comprising a circulation pump disposed in the third fluid path.

5. The apparatus of claim 3, further comprising a vent portion, disposed in the third fluid path between the process chamber and the mixer, configured to discharge at least a portion of used supercritical material provided from the process chamber.

6. The apparatus of claim 5, wherein the supercritical material supplying unit is configured to supply additional supercritical material to the mixer upon discharging at least a portion of used supercritical material.

7. The apparatus of claim 1, further comprising:
a third fluid path between the process chamber and the first location along the first fluid path upstream of the process chamber, the third fluid path configured to deliver supercritical material within the process chamber to the first fluid path.

8. The apparatus of claim 7, further comprising a second temperature control jacket disposed around at least a portion of the third fluid path.

9. The apparatus of claim 1, wherein the first location is upstream of the first regulator.

10. The apparatus of claim 9, further comprising:
a mixer, the mixer comprising the first regulator,
wherein the first location is upstream of the mixer.

11. The apparatus of claim 10, further comprising the first source, the first material, the second source and the second material, wherein the first source and second sources are containers.

12. The apparatus of claim 11, wherein the second material is selected from the group consisting of: a fluoride, a pyridine, F-AOT, a fluorine-based surfactant, and an alcohol.

13. The apparatus of claim 11, wherein the first material comprises a solvent and the second material comprises an etching chemical.

14. The apparatus of claim 13, wherein the first material is carbon dioxide.

15. The apparatus of claim 11, wherein the first material comprises a solvent and the second material comprises a cleaning chemical.

16. The apparatus of claim 15, wherein the first material is carbon dioxide.

17. The apparatus of claim 10, further comprising a second regulator, the second regulator being disposed in the second fluid path between the second source and the first location.

18. The apparatus of claim 17, wherein the second regulator comprises a valve.

19. The apparatus of claim 1, further comprising the first source and the first material, wherein the first material is carbon dioxide and the supercritical material supplying unit is configured to supply supercritical carbon dioxide to the process chamber.

20. The apparatus of claim 1, further comprising a separator configured to receive process chamber material from the process chamber and separate the first material from other materials of the process chamber material.

21. The apparatus of claim 20, wherein the separator is configured to receive a material for neutralizing a chemical of the process chamber material.

22. The apparatus of claim 20, wherein the first material is a solvent.

23. The apparatus of claim 22, further comprising the first source and the first material, wherein the first material is carbon dioxide and the supercritical material supplying unit is configured to supply supercritical carbon dioxide to the process chamber.

24. The apparatus of claim 22, further comprising a discharge fluid path between the process chamber and the separator, the discharge fluid path configured to provide pressurized solvent from the process chamber to the separator.

25. The apparatus of claim 24, further comprising a second temperature control jacket disposed around at least a portion of the discharge fluid path.

26. The apparatus of claim 24, further comprising a discharge valve disposed in the discharge fluid path, between the process chamber and the separator.

27. The apparatus of claim 24, further comprising a rupture disk in fluid communication with the discharge fluid path configured to address an abrupt discharge of the pressurized solvent from the process chamber.

28. The apparatus of claim 27, wherein the pressurized solvent is a supercritical material.

29. The apparatus of claim 22, wherein the solvent is carbon dioxide.

30. The apparatus of claim 1, further comprising a temperature control unit, wherein the first temperature control jacket is controlled by the temperature control unit.

31. The apparatus of claim 30, wherein the first fluid path comprises a first pipe disposed between the first pressure pump and the first regulator, wherein the first control jacket is disposed around the first pipe.

32. The apparatus of claim 31, wherein the first fluid path comprises a second pipe disposed between the first regulator and the process chamber, and the apparatus further comprises a second temperature control jacket, controlled by the control unit, disposed around the second pipe.

33. The apparatus of claim 1, further comprising:
a mixer, the mixer comprising the first regulator,
wherein the first fluid path comprises a first pipe connected to the mixer, and
wherein the first control jacket is disposed about the first pipe.

34. The apparatus of claim 33, further comprising:
a second pipe disposed in the first fluid path between the mixer and the process chamber; and
a second temperature control jacket disposed about the second pipe.

35. The apparatus of claim 1, wherein the temperature at which the process chamber is configured to be maintained is in a range of about 31.1° C. to 100° C., and the pressure at which the process chamber is configured to be maintained is in a range of about 1085 psi to 4000 psi.

* * * * *

UNITED STATES PATENT AND TRADEMARK OFFICE
CERTIFICATE OF CORRECTION

PATENT NO. : 8,790,470 B2  
APPLICATION NO. : 13/326940  
DATED : July 29, 2014  
INVENTOR(S) : Hyo-san Lee et al.

Page 1 of 1

It is certified that error appears in the above-identified patent and that said Letters Patent is hereby corrected as shown below:

On the title page, item 73 should be changed to list the assignee information as:

Samsung Electronics Co., Ltd.,
Suwon-si, Republic of Korea

Pukyong National University Industry-University Cooperation Foundation
Busan, Republic of Korea Signed and Sealed this
Second Day of February, 2016

Michelle K. Lee
*Director of the United States Patent and Trademark Office*